United States Patent
Rowell

(10) Patent No.: US 6,369,670 B1
(45) Date of Patent: Apr. 9, 2002

(54) DYNAMICALLY ADJUSTABLE TAPPED DELAY LINE

(75) Inventor: Anthony S. Rowell, Irchester (GB)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/406,085

(22) Filed: Sep. 27, 1999

(51) Int. Cl.⁷ .............................. H03H 7/20; H03H 7/38

(52) U.S. Cl. ....................................... 333/139; 333/166

(58) Field of Search ................................ 333/139, 166; 327/161

(56) References Cited

U.S. PATENT DOCUMENTS 5,663,767 A  *  9/1997  Rumreich et al. ........... 348/537
5,900,762 A  *  5/1999  Ramakrishnan ............. 327/277

* cited by examiner

Primary Examiner—Robert Pascal
Assistant Examiner—Kimberly E Glenn
(74) Attorney, Agent, or Firm—Pedro P. Hernandez; W. James Brady, III; Frederick J. Telecky, Jr.

(57) ABSTRACT

A circuit (43) generates one or more signals to be delayed by a corresponding time intervals. Tapped delay lines (40) are coupled to the signals, each tapped delay line including a plurality of delay elements (42) and having a plurality of exit points (E) through which said signal may propagate. A test circuit (20) determines a delay associated with a delay element in the circuit and selects one of said exit points of each of said tapped delay lines based on said delay.

20 Claims, 1 Drawing Sheet

DYNAMICALLY ADJUSTABLE TAPPED DELAY LINE

CROSS-REFERENCE TO RELATED APPLICATIONS

Not Applicable

STATEMENT OF FEDERALLY SPONSORED RESEARCH OR DEVELOPMENT

Not Applicable

BACKGROUND OF THE INVENTION

1. Technical Field

This invention relates in general to electronic circuits and, more particularly, to circuits using delay lines.

2. Description of the Related Art

In complex electronic circuits, it is not uncommon to for circuit designers to use one or more delay lines in order to adjust the relationship between signals such that multiple signals are aligned within a predetermined time window.

A problem with using delay lines to align signals concerns the multiple factors that have bearing on the amount of delay provided by the delay line. First, fabrication variations will cause delay lines from chip to chip to vary. Second, operating temperature, voltage and other environmental variations can affect the delay provided by the delay lines. Accordingly, a delay line having variations at one extreme can have a significantly greater delay than a delay line at the opposite extreme.

A circuit designer can ameliorate some variations by careful design. Commonly, delay lines are designed such that the delayed signals will be aligned at the middle of a time window under nominal conditions to provide as much leeway on either side of nominal as possible. Further, improved processing techniques can reduce variations between chips. However, as circuits are designed to operate at higher and higher speeds, the tolerance for variations is greatly reduced and the precautions described above have less chance of success.

Accordingly, a need has arisen for a highly accurate delay line.

BRIEF SUMMARY OF THE INVENTION

A circuit generates one or more signals to be delayed. Tapped delay lines are coupled to the signals, each tapped delay line including a plurality of delay elements and having a plurality of exit points through which said signal may propagate. A test circuit determines a delay associated with a delay element in the circuit and selects one of said exit points of each of said tapped delay lines based on said delay.

The present invention provides significant advantages over the prior art. First, a high degree of accuracy can be maintained in delaying signals to align within a given time window by using actual data during operation of the circuit. Second, the accuracy can be maintained despite changing environmental conditions. Third, the addition of the test circuitry adds only a minimal amount of additional devices to a circuit.

BRIEF DESCRIPTION OF THE SEVERAL VIEWS OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The present invention is best understood in relation to FIGS. 1–4 of the drawings, like numerals being used for like elements of the various drawings.

Figure 1:
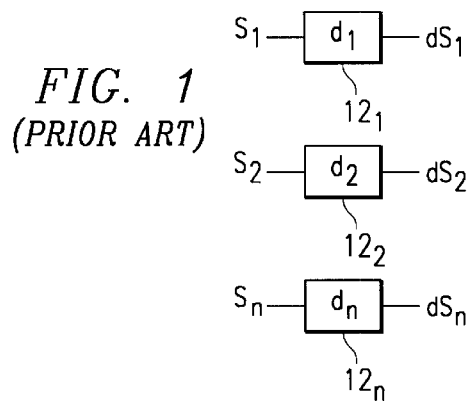
FIG. 1 illustrates a prior art delay circuit.

FIG. 1 illustrates a prior art circuit 10 using one or more delay lines to control the propagation signals through the circuit. In FIG. 1, a plurality of signals $S_1, S_2, \ldots S_n$, are received by respective delay lines 12 (individually referenced as delay circuits $12_1$ through $12_n$, having corresponding nominal delays, $d_1, d_2, \ldots d_n$. The output signals from each of the delay circuits are designated as $dS_1, dS_2, \ldots dS_n$.

In operation, the delays associated with each of the delay lines 12 can vary due to processing and environmental factors. Thus, especially in high frequency circuits, the output signals, $dS_1, dS_2, \ldots dS_n$, may not align as desired.

Figure 2:
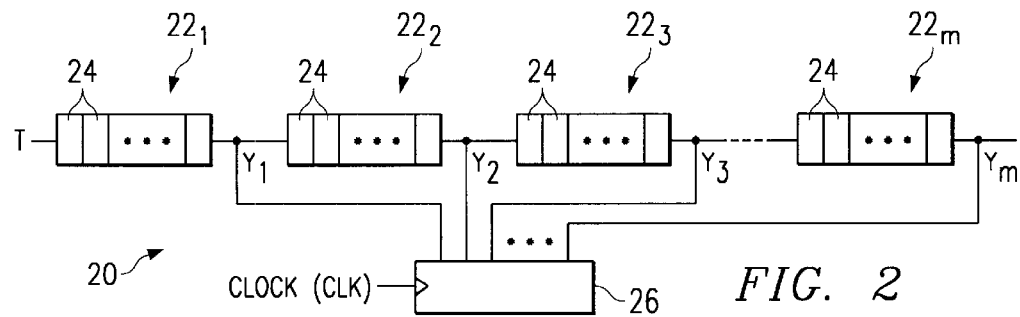
FIG. 2 illustrates a delay element test circuit.

FIG. 2 illustrates a block diagram of a delay element test circuit 20. The test circuit 20 comprises a plurality of m delay stages 22 (individually referenced as delay stages $22_1$ through $22_m$) connected in series, each delay stage 22 formed of a plurality of delay elements 24. The number of delay elements 24 in a stage 22 may vary from stage to stage. Each element in a delay stage could be, for example, a pair of inverters. The outputs ($Y_1$ through $Y_m$) of each delay stage are coupled to one bit of a latch 26 or other memory circuit.

In operation, a test signal T is input the first of the series connected delay stages 22. For purpose of illustration, it will be assumed that T transitions from a low logic value to a high value upon the leading edge of a clock signal CLK and, further, that a low signal has previously propagated through all of the series connected delay stages 24. Test signal T is high for at least one full clock period.

At the next leading edge of CLK, the outputs of the delay stages 22 are stored in latch 26. At this point, if test signal T has propagated through a delay stage 22, the output of that delay stage will be a "1". On the other hand, if the test signal has not propagated through a test stage, the output of that test stage will be a "0". Accordingly, the latch contains a value indicative of the speed through which the test signal propagates through the delay elements and, hence, the actual delay provided by each delay element.

The number of stages 22 and the number of delay elements 24 used in a given stage 22 can be tailored to the accuracy required in a given implementation.

Figure 3:
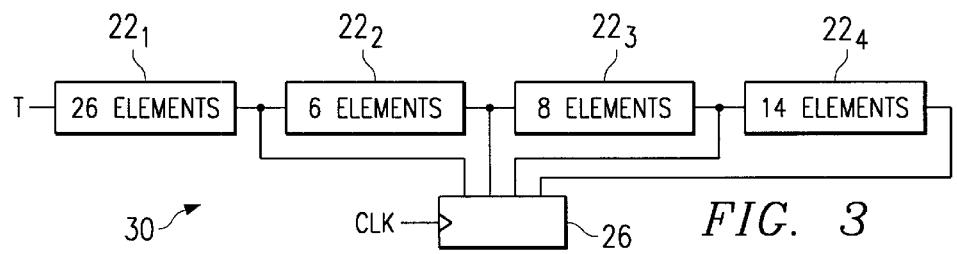
FIG. 3 illustrates an exemplary delay element test circuit.

FIG. 3 illustrates an exemplary test circuit 30 to demonstrate the operation of the test circuit. The first stage $22_1$ has twenty six delay elements 24, second stage $22_2$ has six delay elements 24, third stage $22_3$ has eight delay elements 24, and fourth stage $22_4$ has fourteen delay elements 24.

Assuming an 8 ns clock signal and an expected delay range of 0.1 to 0.35 ns per delay element, the propagation through the test circuit 30 provides the results shown in Table 1.

TABLE 1

Results

| $Y_{1-4}$ | Delay per element (ns) | Approximate % of expected range |
|---|---|---|
| 0000 | >0.31 | >80% |
| 1000 | <=0.31, >0.25 | 80% |
| 1100 | <=0.25, >0.20 | 60% |
| 1110 | <=0.20, >0.15 | 40% |
| 1111 | <=0.15, | 20% |

It should be noted that the values for $Y_{1-4}$ shown in Table 1 are the only valid results. Any other values are invalid and should be ignored.

Based on the value in latch 26, one or more delay lines can be accurately controlled to provide an expected delay within an acceptable threshold. Since the fabrication and environmental conditions are generally fairly constant for an entire chip, one test circuit 20 can be used to control all delay lines for the chip. In certain cases, it may be desirable to use more than one test circuit 20.

Figure 4:
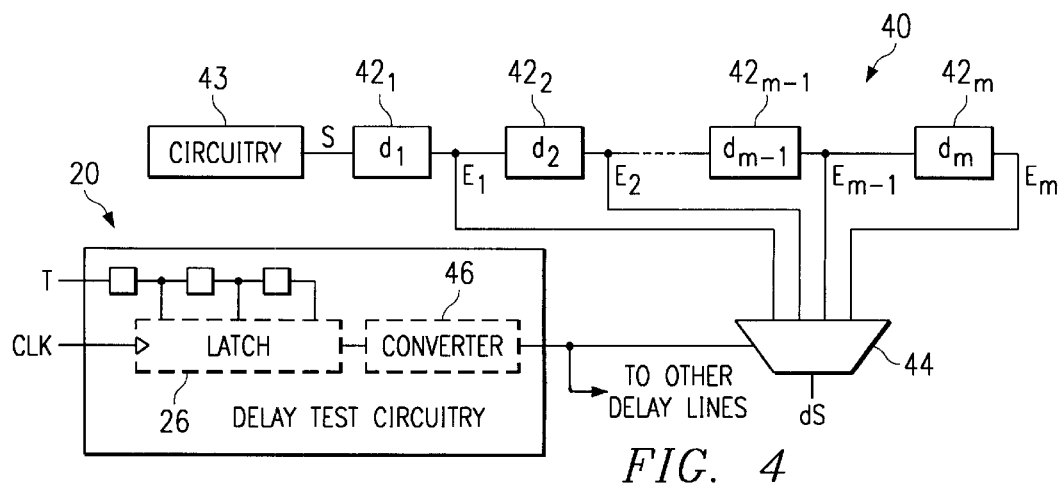
FIG. 4 illustrates a circuit using the delay element test circuit of FIG. 2 to control the delay to one or more signals.

FIG. 4 illustrates a test circuit 20 controlling a delay line 40. A tapped delay line 40 comprises a plurality of serially connected stages 42, referenced individually as stages $42_1$ through $42_m$. Tapped delay lines are known in the prior art and are used for providing a varying degree of delay to a signal. A signal S from circuitry 43 is applied to the first stage $42_1$. The outputs $E_1$ through $E_m$ of the respective stages $42_1$ through $42_m$ are coupled to a multiplexer 44. The latch 26 of delay element test circuit 20 is coupled to converter 46, which generates a binary value based on the highest order "1" value from latch 26. The output of converter 46 is coupled to the control port of multiplexer 44 (alternatively, converter 46 could be incorporated into the control circuitry of multiplexer 44 ).

In operation, the result of each test performed by delay element test circuit 26 controls the number of stages 42 of the tapped delay line 40 through which signal S travels. If the test circuit 26 indicates that the delay elements in the circuit have a have a higher than nominal delay, then the multiplexer 44 will pass the output of a delay stage 42 that is early in the line 40. If the test circuit 26 indicates that the delay elements have a shorter than nominal delay, then the multiplexer 44 will pass the output of a delay stage 42 that is late in the line 40. If the test circuit indicates that the delay elements have a nominal delay, then the multiplexer 44 will pas the output of a delay stage 42 that is in the middle of the line 40.

During the operation of a circuit, environmental conditions can change the delay through delay elements in the delay lines 40 of a circuit. The test circuitry 26 can perform a test at predetermined intervals, or upon other events (such as alarms from a temperature sensor), and dynamically change the number of stages 42 through which a signal passes, providing accurate delays through the delay lines 40 despite changing environmental conditions. As the value in latch 26 changes, the number of stages through which a signal passes is automatically changed, maintaining a stable amount of delay.

As in the case of the test circuit, the tapped delay lines 40 can have any number of stages 42 and the number of delay elements in each stage can be tailored to a given implementation. The number of stages 42 and the delay of each stage can be tailored to the particular implementation to provide the needed accuracy.

The present invention provides significant advantages over the prior art. First, a high degree of accuracy can be maintained in delaying signals to align within a given time window. Second, the accuracy can be maintained despite changing environmental conditions. Third, the addition of the test circuitry adds only a minimal amount of additional devices to a circuit.

Although the Detailed Description of the invention has been directed to certain exemplary embodiments, various modifications of these embodiments, as well as alternative embodiments, will be suggested to those skilled in the art. The invention encompasses any modifications or alternative embodiments that fall within the scope of the claims.

What is claimed is:

1. A delay circuit for delaying a signal, comprising:
   a tapped delay line having an input for receiving the signal, the tapped delay line comprising a plurality of delay elements and having a plurality of exit points through which said signal may propagate; and
   a test circuit for selecting one of said exit points, said test circuit including an input for receiving a test signal, a plurality of delay elements coupled to the input, and a circuit coupled to the plurality of delay elements that provides a value indicative of the speed through which the test signal propagates through one or more of the delay elements found in the test circuit.

2. The circuit of claim 1 wherein said tapped delay line comprises a plurality of serially connected stages, each stage comprising one or more of the plurality of delay elements, the output of each stage being one of said exit points.

3. A circuit according to claim 2, wherein said serially connected stages of one or more tapped delay lines each have a delay associated therewith which may increase and which may decrease in their relative delay from one to another.

4. A circuit as defined in claim 1, wherein the circuit coupled to the plurality of delay elements in the test circuit comprises a storage element.

5. A circuit as defined in claim 1, wherein the plurality of delay elements in the test circuit are grouped into one or more serially connected delay stages and each stage has an output and the circuit coupled to the plurality of delay elements is connected to the output of each of the serially connected stages.

6. A circuit comprising:
   circuitry generating one or more signals to be delayed;
   one or more tapped delay lines coupled to respective signals, each tapped delay line comprising a plurality of delay elements and having a plurality of exit points through which said signal may propagate, said one or more tapped delay lines each comprise a plurality of serially connected stages, each stage comprising one or more delay elements, the output of each stage being one of said exit points;
   a test circuit for determining a delay associated with a delay element in the test circuit and selecting one of said exit points of each of said tapped delay lines based on said delay; and each of said tapped delay lines further comprises a multiplexer for passing the signal at one of said exit points.

7. A circuit comprising:
   circuitry generating one or more signals to be delayed;
   one or more tapped delay lines coupled to respective signals, each tapped delay line comprising a plurality of delay elements and having a plurality of exit points through which said signal may propagate;

a test circuit for determining a delay associated with a delay element in the test circuit and selecting one of said exit points of each of said tapped delay lines based on said delay, said test circuit comprises a plurality of serially connected delay stages, each stage comprising one or more delay elements; and a latch coupled to the output of each delay stage.

8. A dynamically programmable delay line comprising:

a tapped delay line coupled to a signal comprising a plurality of delay elements and having a plurality of exit points through which said signal may propagate; and a test circuit for determining a delay associated with a delay element in the test circuit and selecting one of said exit points in said tapped delay line based on said delay.

9. The delay line of claim 8 herein said tapped delay line comprises a plurality of serially connected stages, each stage comprising one or more of the delay elements, the output of each stage being one of said exit points.

10. The delay line of claim 8 wherein said test circuit comprises a plurality of serially connected delay stages, each delay stage comprising one or more delay elements.

11. A dynamically programmable delay line comprising:

a tapped delay line coupled to a signal comprising a plurality of delay elements and having a plurality of exit points through which said signal may propagate, said tapped delay line further comprises a plurality of serially connected stages, each stage comprising one or more delay elements, the output of each stage being one of said exit points;

a test circuit for determining a delay associated with a delay element in the circuit and selecting one of said exit points in said tapped delay line based on said delay; and said tapped delay line further comprises a multiplexer for passing the signal at one of said exit points.

12. A dynamically programmable delay line comprising:

a tapped delay line coupled to a signal comprising a plurality of delay elements and having a plurality of exit points through which said signal may propagate;

a test circuit for determining a delay associated with a delay element in the circuit and selecting one of said exit points in said tapped delay line based on said delay said test circuit includes a plurality of serially connected delay stages, each delay stage comprising one or more delay elements; and a latch coupled to the output of each delay stage.

13. A method of controlling the amount of delay applied to a signal from a delay circuit having a plurality of delay stages, comprising the steps of:

timing the propagation of a test signal through a delay test circuit having a known number of delay elements;

adjusting the number of delay stages applied to the signal by the delay circuit responsive to said timing.

14. The method of claims 13 wherein said timing step comprising the steps of:

applying the test signal to a plurality of serially connected delay stages;

generating a value based on the number of delay stages through which the test signal propagates in a predetermined time frame.

15. The method of claim 14 wherein said step of adjusting the number of delay stages comprises selecting an output of one of said stages responsive to said value.

16. The method of claim 15 wherein said selecting step comprises the step of receiving the output of said delay stages in respective inputs of a multiplexer and selecting one of said inputs responsive to said value.

17. The method of claim 13 and further comprising the step of repeating said timing and adjusting steps during operation of said circuit.

18. The method of claim 17 wherein said repeating step comprises the step of repeating said timing and adjusting steps at predetermined time intervals.

19. The method of claim 17 wherein said repeating step comprises the step of repeating said timing and adjusting steps at predetermined events.

20. A circuit comprising:

circuitry generating one or more signals to be delayed;

one or more tapped delay lines coupled to respective signals, each tapped delay line comprising a plurality of delay elements and having a plurality of exit points through which said signal may propagate, said one or more tapped delay lines each comprise a plurality of serially connected stages, each stage comprising one or more delay elements, the output of each stage being one of said exit points, and said serially connected stages of one or more tapped delay lines each have a delay associated therewith which may increase and which may decrease in their relative delay from one another;

a test circuit for determining a delay associated with a delay element in the test circuit and selecting one of said exit points of each of said tapped delay lines based on said delay; and said serially connected stages of one or more tapped delay lines each have a delay associated therewith which, for at least one of said stages, decreases in its relative delay from a previous stage.

\* \* \* \* \*